(12) United States Patent
Cao et al.

(10) Patent No.: US 11,522,099 B2
(45) Date of Patent: Dec. 6, 2022

(54) METHOD OF MAKING RADIATION DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 76 days.

(21) Appl. No.: 16/655,213

(22) Filed: Oct. 16, 2019

(65) Prior Publication Data

US 2020/0052148 A1 Feb. 13, 2020

Related U.S. Application Data

(63) Continuation of application No. PCT/CN2017/082822, filed on May 3, 2017.

(51) Int. Cl.
*H01L 31/18* (2006.01)
*G01T 1/24* (2006.01)

(52) U.S. Cl.
CPC .......... *H01L 31/1832* (2013.01); *G01T 1/243* (2013.01); *H01L 31/1836* (2013.01); *H01L 31/1872* (2013.01)

(58) Field of Classification Search
CPC .......... H01L 21/02625; H01L 31/1832; H01L 31/02966; H01L 21/02664; H01L 21/02598; H01L 31/1872; H01L 27/14696; H01L 22/32; G01T 1/243; G01T 1/24; C30B 29/48
See application file for complete search history.

(56) References Cited

U.S. PATENT DOCUMENTS

| | | |
|---|---|---|
| 4,965,649 A | 10/1990 | Zanio et al. |
| 8,778,715 B2 | 7/2014 | Bellinger et al. |
| 9,151,853 B2 | 10/2015 | Dahal et al. |
| 2004/0043584 A1 | 3/2004 | Thomas et al. |
| 2005/0164490 A1* | 7/2005 | Morrow ............. H01L 25/0657 438/629 |

(Continued)

FOREIGN PATENT DOCUMENTS

| | | | |
|---|---|---|---|
| CN | 107153214 A | * 9/2017 | ............. G01T 1/24 |
| EP | 0450827 B1 | 5/1997 | |

(Continued)

*Primary Examiner* — Alia Sabur
(74) *Attorney, Agent, or Firm* — IPo, PLLC; Qian Gu

(57) ABSTRACT

Disclosed herein is a method for making a radiation detector. The method comprises forming a recess into a substrate and forming a semiconductor single crystal in the recess. The semiconductor single crystal may be a cadmium zinc telluride (CdZnTe) single crystal or a cadmium telluride (CdTe) single crystal. The method further comprises forming electrical contacts on the semi conductor single crystal and bonding the substrate to another substrate comprising an electronic system therein or thereon. The electronic system is connected to the electrical contact of the semiconductor single crystal and configured to process an electrical signal generated by the semiconductor single crystal upon absorption of radiation particles.

12 Claims, 17 Drawing Sheets

(56) References Cited

U.S. PATENT DOCUMENTS

| | | | |
|---|---|---|---|
| 2005/0170649 A1* | 8/2005 | Hirano | C30B 29/48 |
| | | | 438/689 |
| 2007/0222012 A1* | 9/2007 | Aurola | H01L 27/14609 |
| | | | 257/430 |
| 2007/0235656 A1* | 10/2007 | Capote | H01L 27/1469 |
| | | | 250/370.13 |
| 2009/0101909 A1* | 4/2009 | Chen | H01L 31/035281 |
| | | | 257/65 |
| 2010/0246758 A1 | 9/2010 | Hackenschmied et al. | |
| 2011/0037133 A1 | 2/2011 | Su et al. | |
| 2011/0211668 A1* | 9/2011 | Steadman Booker | G01T 1/249 |
| | | | 378/19 |
| 2014/0077089 A1* | 3/2014 | Orava | G01T 3/06 |
| | | | 250/370.05 |
| 2015/0124940 A1 | 5/2015 | Kim | |
| 2015/0357192 A1* | 12/2015 | Dykaar | C30B 11/003 |
| | | | 438/479 |

FOREIGN PATENT DOCUMENTS

| | | |
|---|---|---|
| TW | I256482 B | 6/2006 |
| TW | I593990 B | 8/2017 |
| WO | 2016053413 A1 | 4/2016 |

* cited by examiner

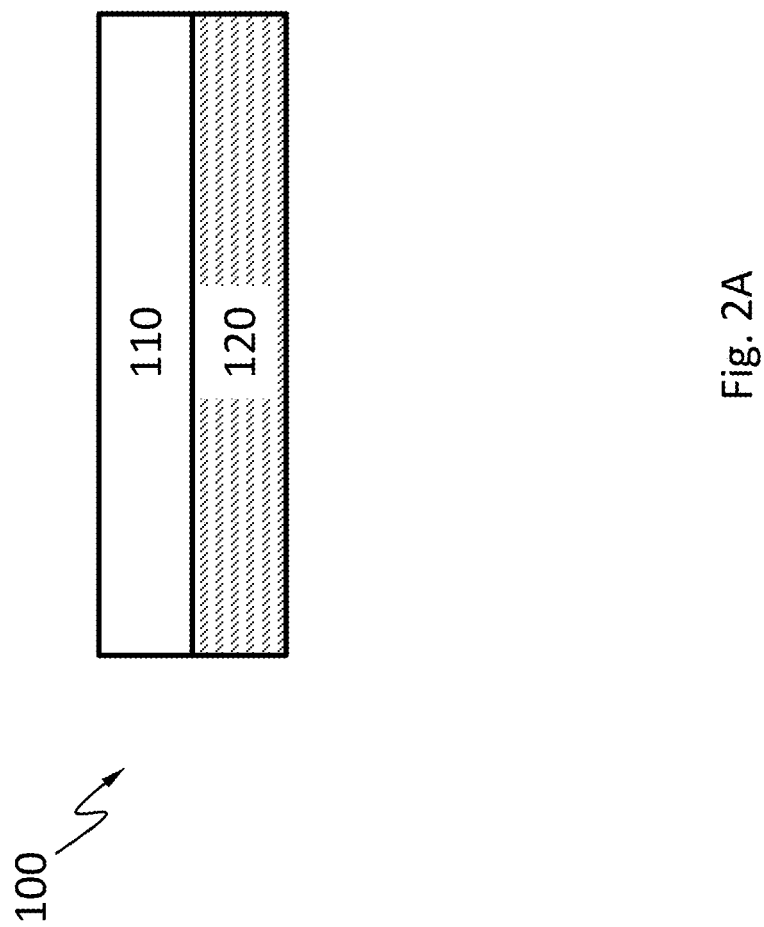

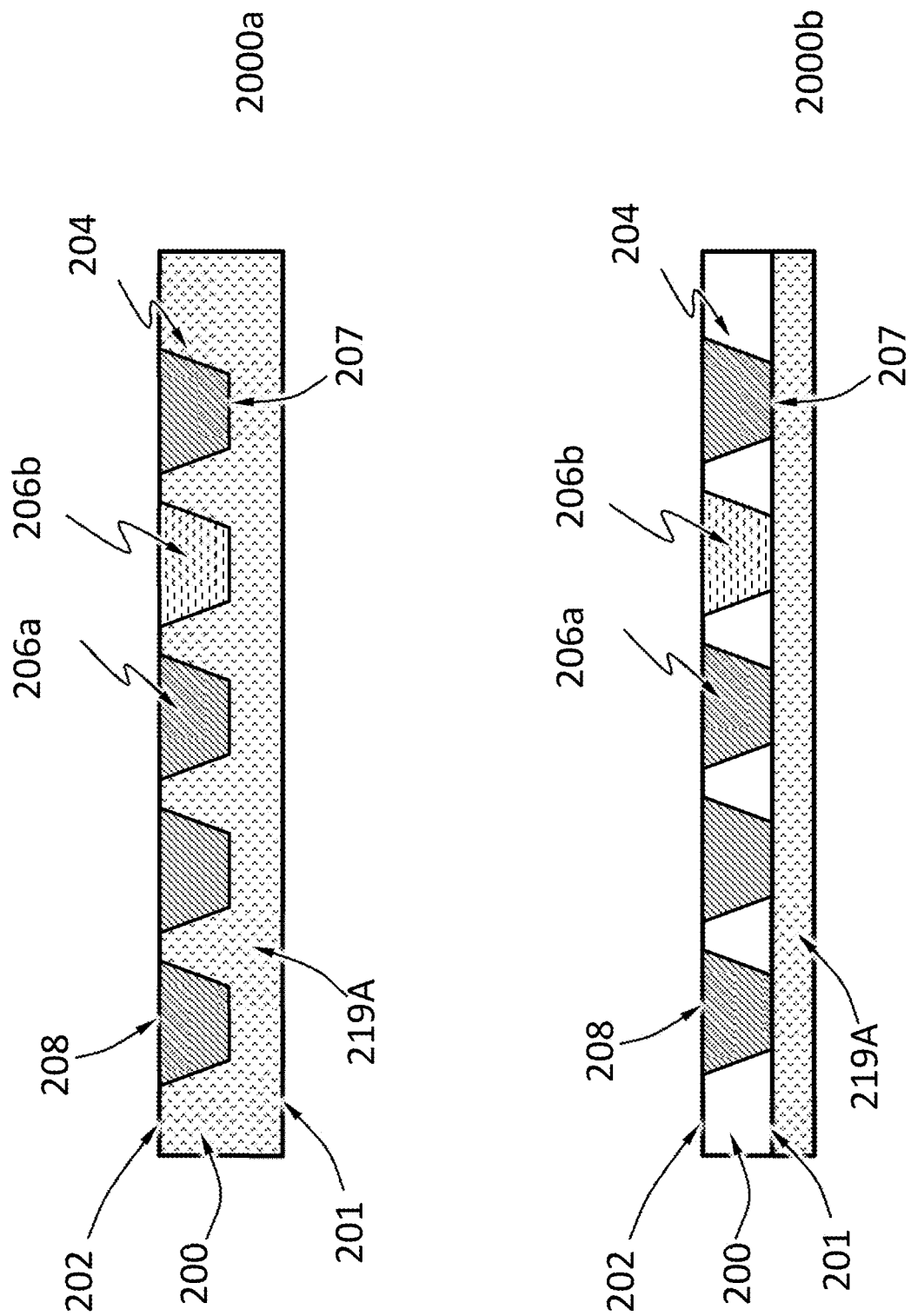

METHOD OF MAKING RADIATION DETECTOR

TECHNICAL FIELD

The disclosure herein relates to methods of making a radiation detector, particularly relates to a method of forming a radiation detector with a semiconductor single crystal.

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or γ-ray. The radiation may be of other types such as α-rays and β-rays.

Cadmium Zinc Telluride (CdZnTe, or $Cd_{1-x}Zn_xTe$) is an alloy of zinc telluride and cadmium telluride and is an excellent candidate for room temperature radiation detection. The x-value is the molar concentration of Zn in CdZnTe. CdZnTe with x-value from 0.04 to 0.2 is considered promising for detector development as it offers good absorption efficiency for incident X-rays, γ-rays while having a relative large energy band gap (e.g., 1.5 eV-1.6 eV) at room temperature. It also has high resistivity to achieve a good signal-to-noise ratio of the radiation detectors. The practical use of CdZnTe detectors covers a wide variety of applications, such as medical and industrial imaging, industrial gauging and non-destructive testing, security and monitoring, nuclear safeguards and non-proliferation, and astrophysics.

SUMMARY

Disclosed herein is a method comprising: forming a recess into a substrate; forming a semiconductor single crystal in the recess.

According to an embodiment, the semiconductor single crystal is a cadmium zinc telluride (CdZnTe) single crystal or a cadmium telluride (CdTe) single crystal.

According to an embodiment, the recess does not contain other semiconductor material except the semiconductor single crystal.

According to an embodiment, the recess does not contain a semiconductor polycrystal.

According to an embodiment, the substrate comprises silicon, germanium, GaAs or a combination thereof.

According to an embodiment, the recess has a shape of a frustum, prism, pyramid, cuboid, cubic or cylinder.

According to an embodiment, forming the recess comprises forming a mask on the substrate and etching a portion of the substrate uncovered by the mask.

According to an embodiment, the mask comprises a metal, silicon nitride, silicon dioxide, or carbon.

According to an embodiment, etching the portion is done by wet etching, dry etching or a combination thereof.

According to an embodiment, forming the semiconductor single crystal in the recess comprises depositing semiconductor particles into the recess, forming a melt by melting the semiconductor particles, and recrystallizing the melt in the recess.

According to an embodiment, recrystallizing the melt in the recess involves cooling the melt at a rate that the melt recrystallizes into a single crystal.

According to an embodiment, cooling the melt is done by moving the melt from a zone with a temperature above or equal to the melting point of the semiconductor particles to another zone with a temperature below the melting point.

According to an embodiment, forming the semiconductor single crystal comprises using a vapor phase precursor.

According to an embodiment, the method further comprises polishing the substrate such that a surface of the semiconductor single crystal and a surface of the substrate are coextensive.

According to an embodiment, the substrate is electrically conductive, wherein the substrate is in electrical contact with the semiconductor single crystal.

According to an embodiment, the method further comprises forming an electrical contact by doping a layer of the substrate from a surface of the substrate, wherein the electrical contact is in electrical contact with the semiconductor single crystal.

According to an embodiment, the method further comprises forming an electrical contact by depositing a layer of conductive material in the interior of the recess before forming the semiconductor single crystal in the recess.

According to an embodiment, the method further comprises forming an electrical contact by polishing a surface of the substrate to expose a surface of the semiconductor single crystal, depositing a layer of conductive material onto the surface of semiconductor single crystal.

According to an embodiment, the electrical contact comprises discrete regions.

According to an embodiment, the method further comprises forming an electrical contact on a surface of the semiconductor single crystal, wherein the surface is not in direct contact with the substrate.

According to an embodiment, the electrical contact comprises discrete regions.

According to an embodiment, the method further comprises bonding the substrate to another substrate comprising an electronic system therein or thereon, wherein the electronic system is connected to the electrical contact of the semiconductor single crystal and configured to process an electrical signal from the electrical contact.

Disclosed herein is a radiation detector comprising: a substrate; a semiconductor single crystal in a recess in the substrate; an electrical contact on the semiconductor single crystal; wherein the radiation detector is configured to absorb radiation particles incident on the semiconductor single crystal and to generate charge carriers.

According to an embodiment, the semiconductor single crystal is a CdZnTe single crystal or a CdTe single crystal.

According to an embodiment, the recess does not contain other semiconductor material except the semiconductor single crystal.

According to an embodiment, the recess does not contain a semiconductor polycrystal.

According to an embodiment, the substrate comprises silicon, germanium, GaAs or a combination thereof.

According to an embodiment, the recess has a shape of a frustum, prism, pyramid, cuboid, cubic or cylinder.

According to an embodiment, the electrical contact comprises discrete regions.

According to an embodiment, a surface of the semiconductor single crystal and a surface of the substrate are coextensive.

According to an embodiment, the radiation detector further comprises another electrical contact on the substrate.

According to an embodiment, the other electrical contact comprises discrete regions.

According to an embodiment, the radiation detector further comprises an electronics layer bonded to the substrate, the electronics layer comprising an electronic system configured to process an electrical signal generated from the charge carriers collected by the electrical contact.

According to an embodiment, the electronic system comprises a voltage comparator configured to compare a voltage of the electrical contact to a first threshold; a counter configured to register a number of radiation particles absorbed by the substrate; a controller; a voltmeter; wherein the controller is configured to start a time delay from a time at which the voltage comparator determines that an absolute value of the voltage equals or exceeds an absolute value of the first threshold; wherein the controller is configured to cause the voltmeter to measure the voltage upon expiration of the time delay; wherein the controller is configured to determine a number of radiation particles by dividing the voltage measured by the voltmeter by a voltage that a single radiation particle would have caused on the electrical contact; wherein the controller is configured to cause the number registered by the counter to increase by the number of radiation particles.

According to an embodiment, the electronic system further comprising a capacitor module electrically connected to the electrical contact, wherein the capacitor module is configured to collect charge carriers from the electrical contact.

According to an embodiment, the controller is configured to connect the electrical contact to an electrical ground.

According to an embodiment, the controller is configured to deactivate the voltage comparator at a beginning of the time delay.

BRIEF DESCRIPTION OF FIGURES

FIG. 2A schematically shows a cross-sectional view of the radiation detector, according to an embodiment.

DETAILED DESCRIPTION

Figure 1:
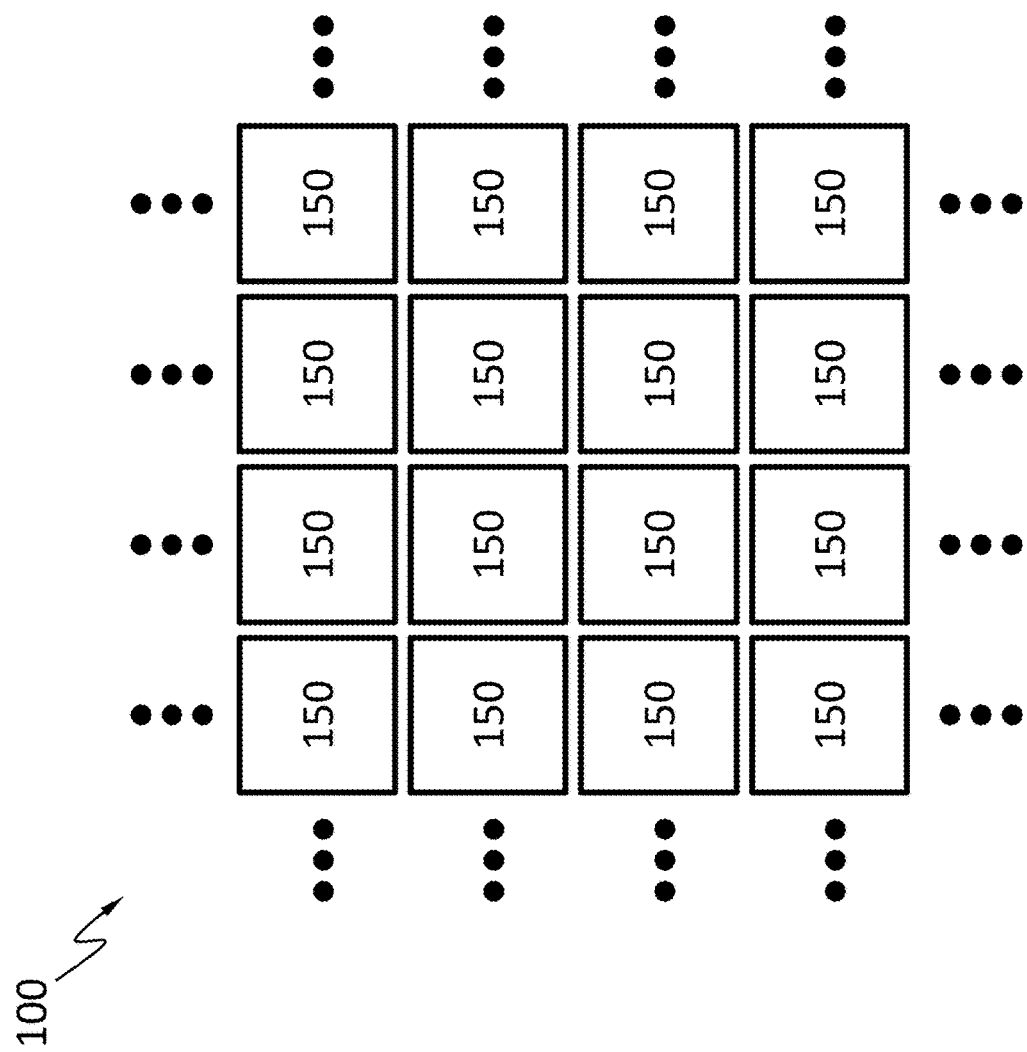
FIG. 1 schematically shows a radiation detector, according to an embodiment.

FIG. 1 schematically shows a radiation detector 100, as an example. The radiation detector 100 has an array of pixels 150. The array may be a rectangular array, a honeycomb array, a hexagonal array or any other suitable array. Each pixel 150 is configured to detect radiation from a radiation source incident thereon and may be configured measure a characteristic (e.g., the energy of the particles, the wavelength, and the frequency) of the radiation. For example, each pixel 150 is configured to count numbers of radiation particles (e.g., photons) incident thereon whose energy falls in a plurality of bins, within a period of time. All the pixels 150 may be configured to count the numbers of radiation particles incident thereon within a plurality of bins of energy within the same period of time. When the incident radiation particles have similar energy, the pixels 150 may be simply configured to count numbers of radiation particles incident thereon within a period of time, without measuring the energy of the individual radiation particles. Each pixel 150 may have its own analog-to-digital converter (ADC) configured to digitize an analog signal representing the energy of an incident radiation particle into a digital signal, or to digitize an analog signal representing the total energy of a plurality of incident radiation particles into a digital signal. Each pixel 150 may be configured to measure its dark current, such as before or concurrently with each radiation particle incident thereon. Each pixel 150 may be configured to deduct the contribution of the dark current from the energy of the radiation particle incident thereon. The pixels 150 may be configured to operate in parallel. For example, when one pixel 150 measures an incident radiation particle, another pixel 150 may be waiting for a radiation particle to arrive. The pixels 150 may not have to be individually addressable.

FIG. 2A schematically shows a cross-sectional view of the radiation detector 100, according to an embodiment. The radiation detector 100 may include a radiation absorption layer 110 configured to absorb an incident radiation and generate electrical signals from incident radiation, and an electronics layer 120 (e.g., an ASIC) for processing or analyzing the electrical signals generates in the radiation absorption layer 110. The radiation detector 100 may or may not include a scintillator. The radiation absorption layer 110 may include a semiconductor material such as, silicon, germanium, GaAs, CdTe, CdZnTe, or a combination thereof. The semiconductor may have a high mass attenuation coefficient for the radiation of interest.

Figure 2B:
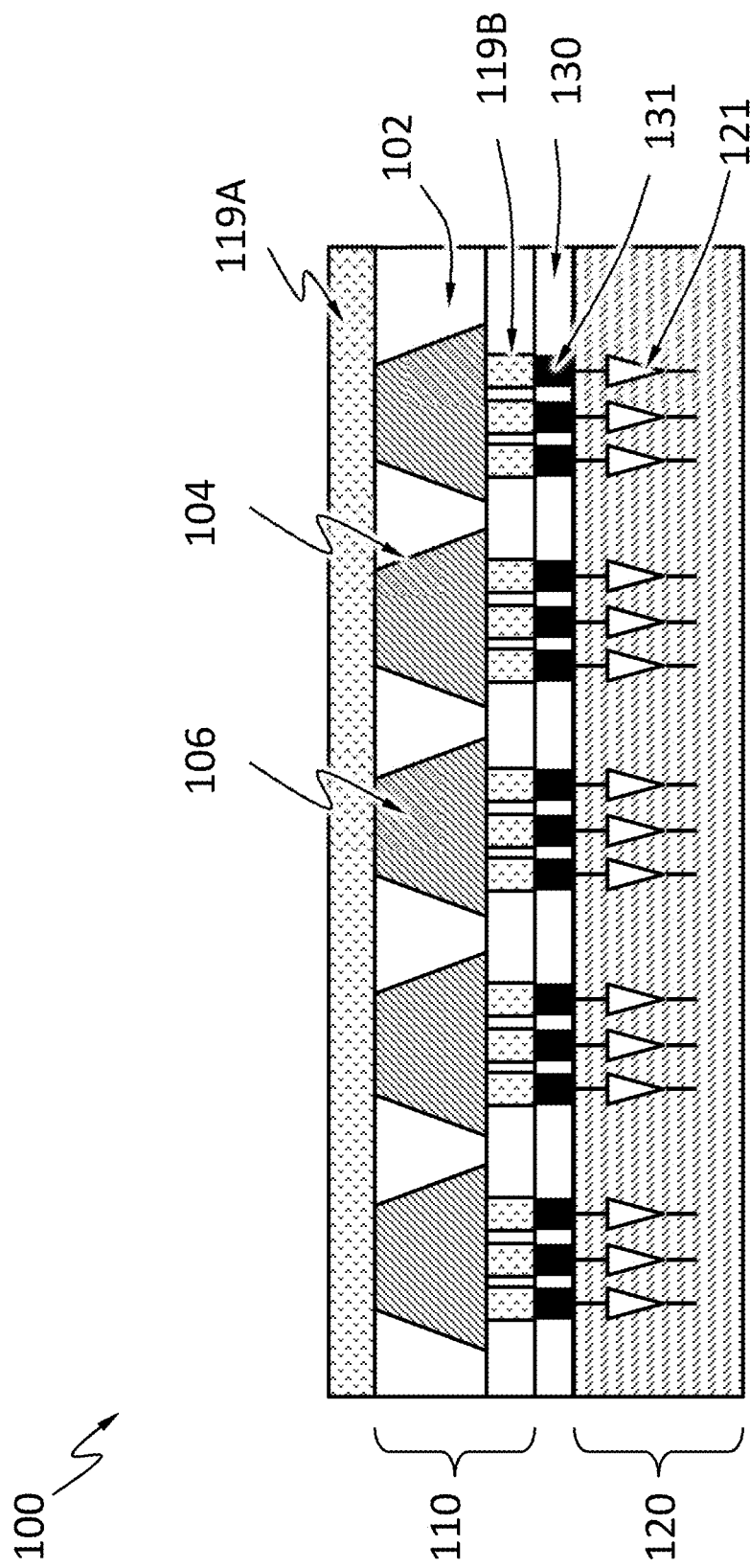
FIG. 2B schematically shows a detailed cross-sectional view of the radiation detector, according to an embodiment.

FIG. 2B schematically shows a detailed cross-sectional view of the radiation detector 100, according to an embodiment. The radiation absorption layer 110 may comprise a substrate 102, one or more recesses 104 in the substrate 102, each of which having a semiconductor single crystal 106 in it, and an electrical contact 119A on the one or more semiconductor single crystals 106. In an embodiment, at least some of the recesses 104 each have one and only one semiconductor single crystal 106, i.e., they each contain no other semiconductor material except the one semiconductor single crystal 106. The substrate 102 may comprise silicon, germanium, GaAs or a combination thereof. Each of the semiconductor single crystals 106 may be a cadmium zinc telluride (CdZnTe) single crystal, a cadmium telluride (CdTe) single crystal, or any other suitable single crystals that can be used to absorb radiation particles incident thereon and generate charge carriers. The electrical contact 119A may comprise a conducting material such as a metal (e.g., gold, copper, aluminum, platinum, etc.), or any other suitable conducting materials (e.g., a doped semiconductor). In an embodiment, a portion or the entire substrate 102 may be doped with p or n type dopants so that the substrate 102 is electrically conductive and can function as the electrical contact 119A. The electrical contact 119A may comprise discrete regions. The radiation absorption layer 110 may further comprise another electrical contact 119B on a surface (e.g., an exposed surface, namely a surface not in direct physical contact with the substrate 102) of the semiconductor single crystals 106, and the electrical contact 119B may comprise discrete regions. Each of the semiconductor single crystals 106 may also be in contact with one or more discrete regions of the electrical contact 119B. The surface of the substrate 102 may be coextensive with the surface of each of the semiconductor single crystals 106. In an embodiment, the surface of each of the semiconductor single crystals 106 may accommodate tens or hundreds of the discrete regions of the electrical contact 119B. The electrical contact 119B may comprise a conducting material such as a metal (e.g., gold, copper, aluminum, platinum, etc.), or any other suitable conducting materials (e.g., a doped semiconductor). The electrical contacts 119A and 119B may be configured to collect the charge carriers generated in the semiconductor single crystal 106.

When the radiation hits the radiation absorption layer 110, the semiconductor single crystals 106 may absorb the radiation particles incident thereon and generate one or more charge carriers by a number of mechanisms. A particle of the radiation may generate 10 to 100000 charge carriers. The charge carriers may drift to the electrical contacts 119A and 119B under an electric field. The field may be an external electric field. In an embodiment, the charge carriers may drift in directions such that the charge carriers generated by a single particle of the radiation are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a radiation particle incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by a particle of the radiation incident therein flow to the discrete portion of the electrical contact 119B. Namely, less than 2%, less than 0.5%, less than 0.1%, or less than 0.01% of these charge carriers flow beyond the pixel 150 associated with the one discrete portion of the electrical contact 119B.

Figure 2C:
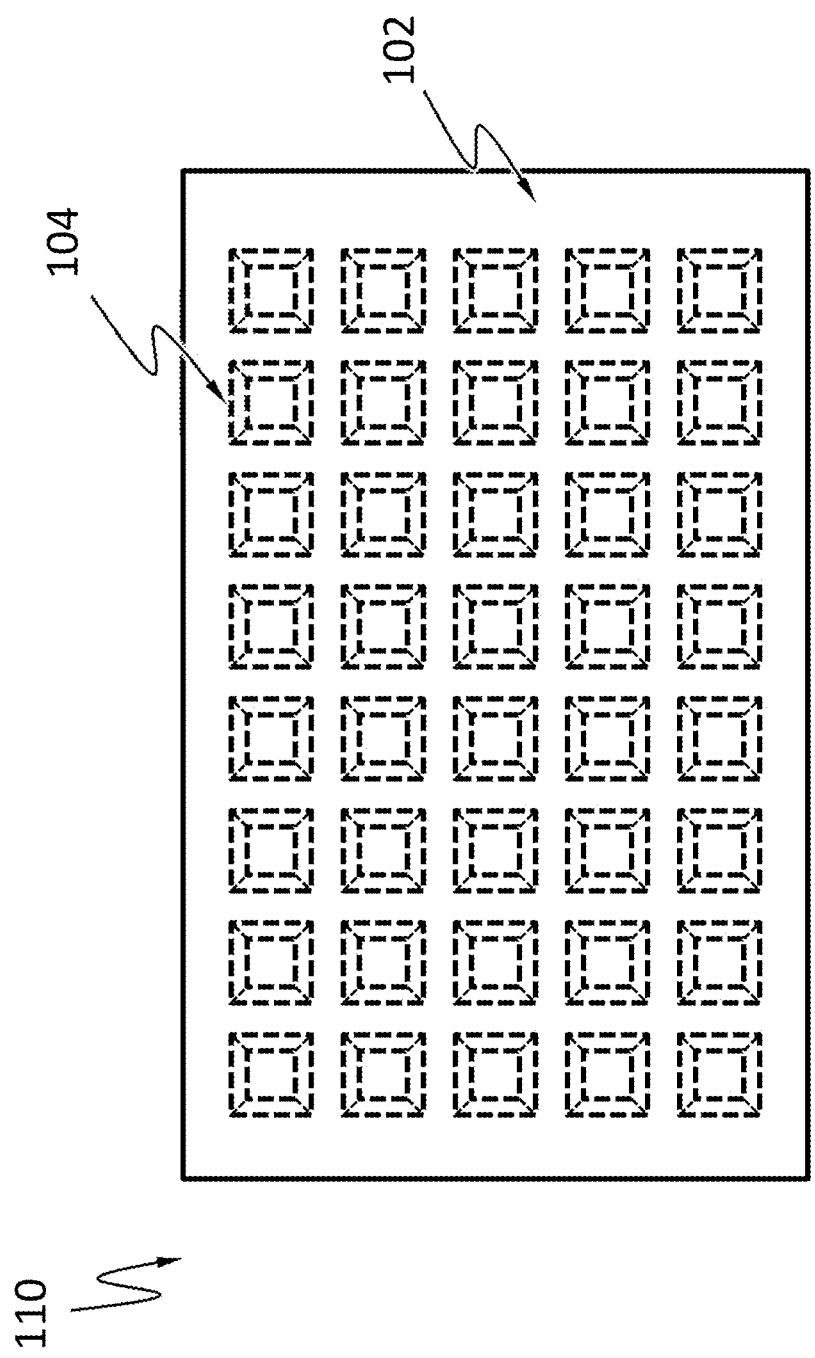
FIG. 2C schematically shows a top view of the radiation absorption layer in FIG. 2B, according to an embodiment.

FIG. 2C schematically shows a top view of the radiation absorption layer 110 in FIG. 2B, according to an embodiment. Each of the recesses 104 may have a shape of a frustum, prism, pyramid, cuboid, cubic or cylinder. The recesses 104 may be arranged into an array such as a rectangular array, a honeycomb array, a hexagonal array or any other suitable array. In example of FIG. 2C, the recesses 104 are arranged into a rectangular array, and each of the recesses 104 has a pyramid shape. The recesses 104 are shown in dashed line since they cannot be seen directly from the top view.

The electronics layer 120 may include an electronic system 121 configured to process electrical signals on the electrical contact 119B generated from the charge carriers collected. The electronic system 121 may include an analog circuitry such as a filter network, amplifiers, integrators, and comparators, or a digital circuitry such as a microprocessors, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

Figure 3:
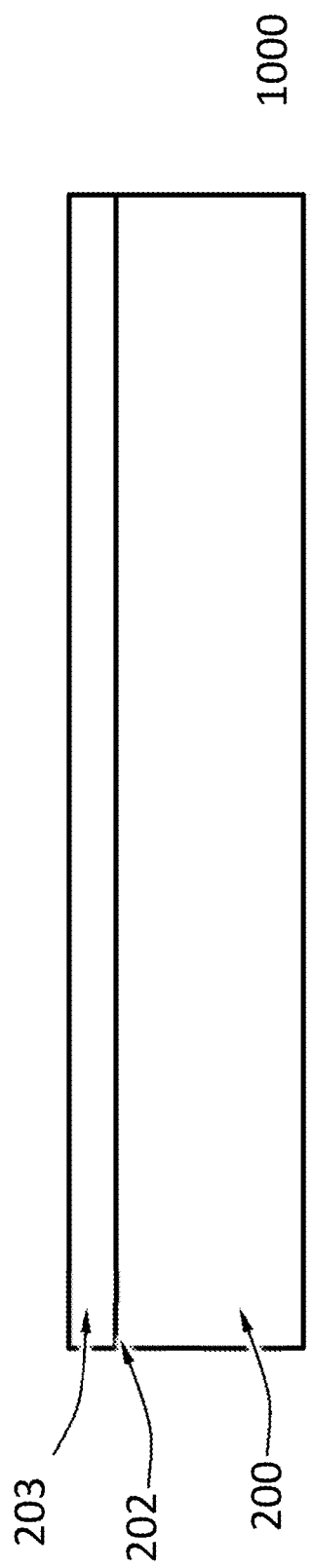
FIG. 3 schematically illustrates a process of forming recesses in the substrate and forming semiconductor single crystal in the recesses in FIG. 2B, according to an embodiment.
Figure 3:
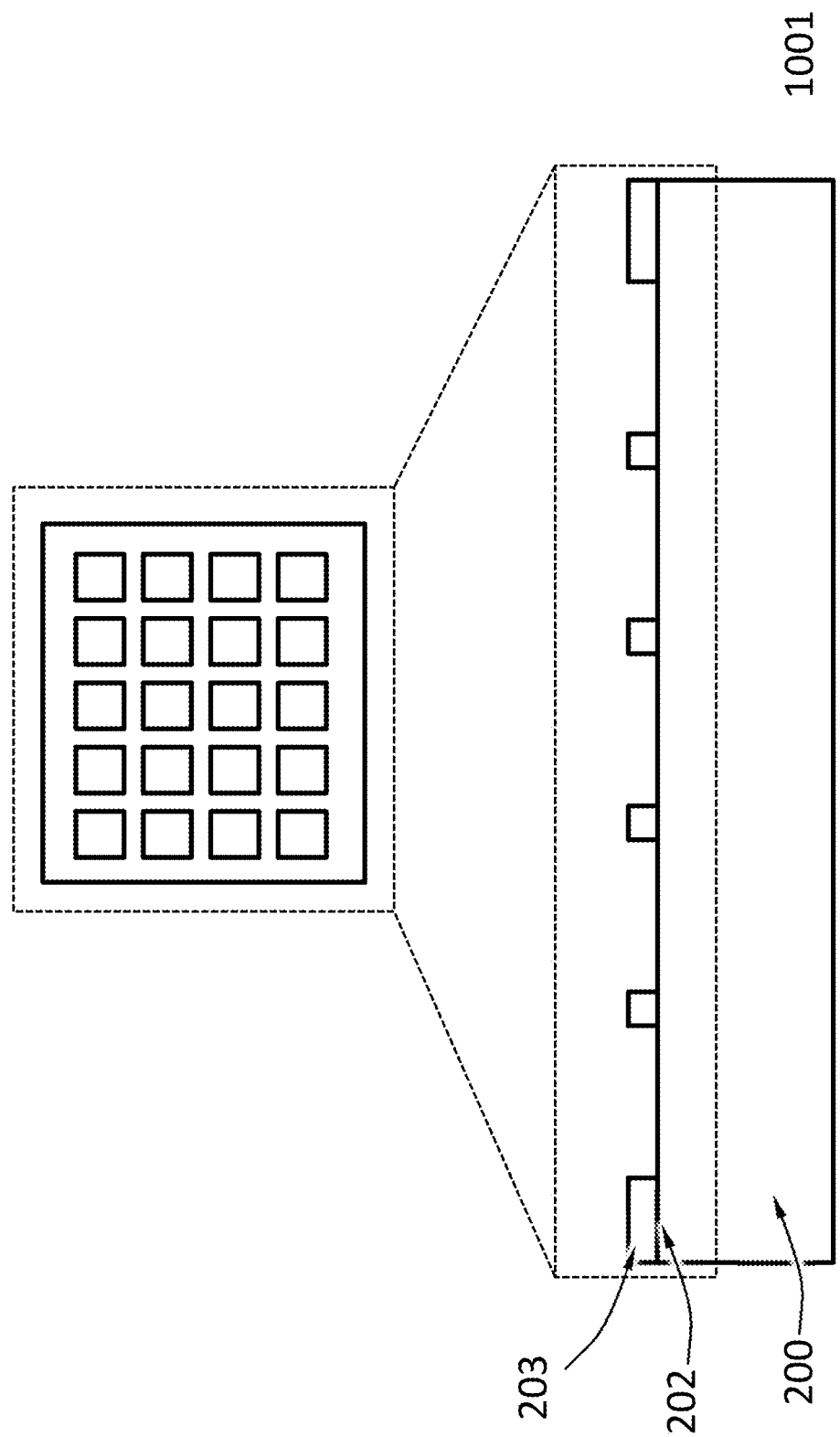
Figure 3:
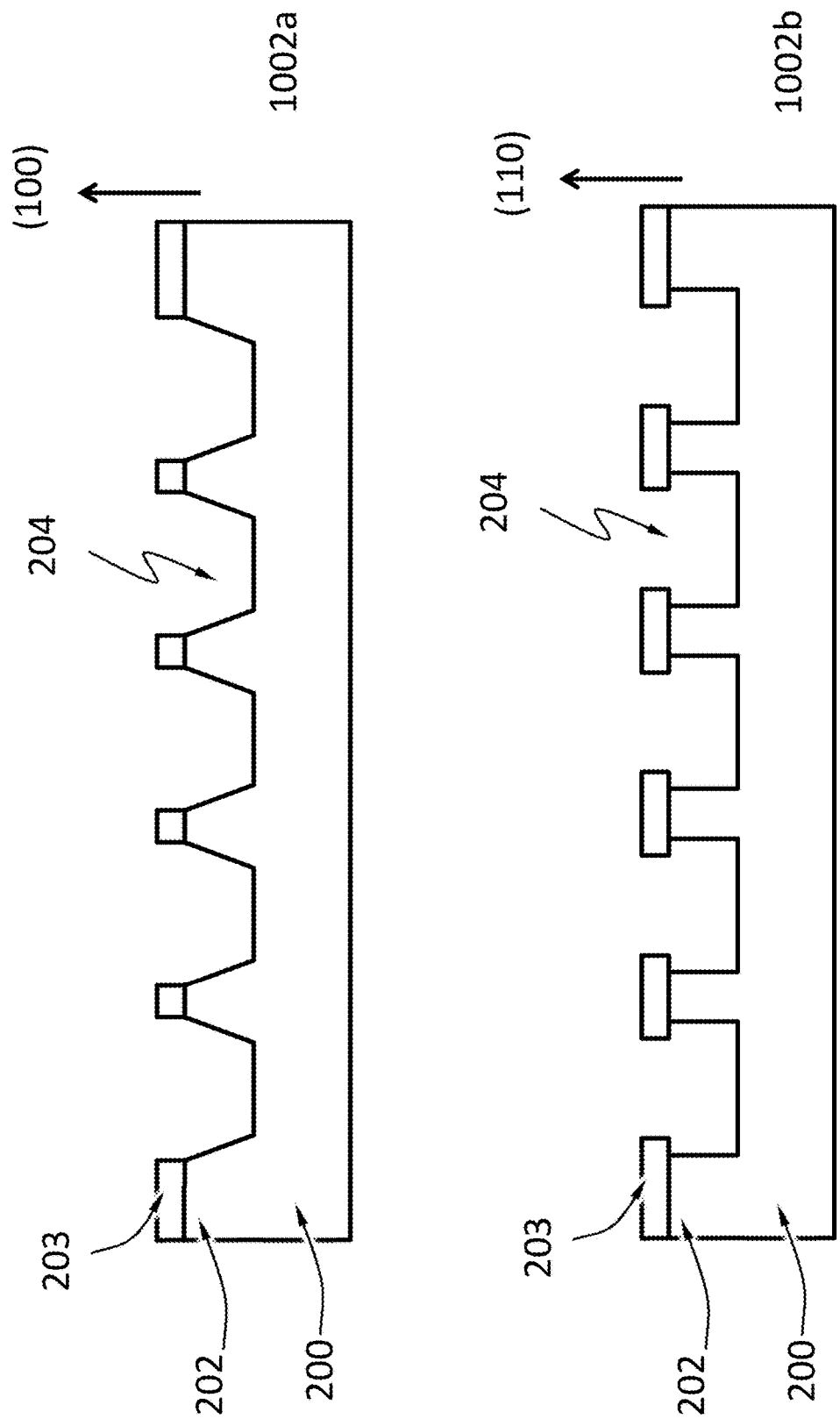
Figure 3:
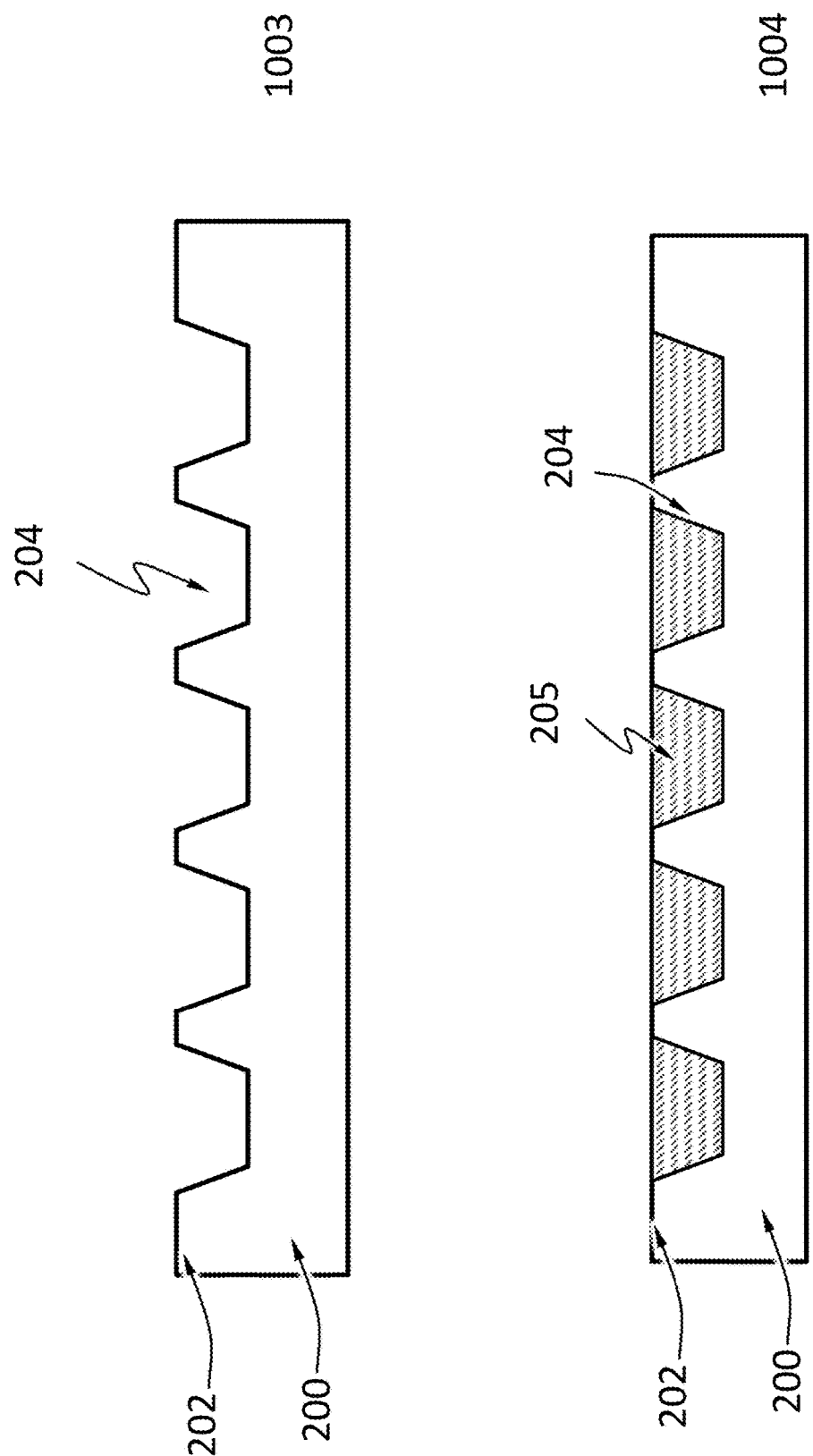
Figure 3:
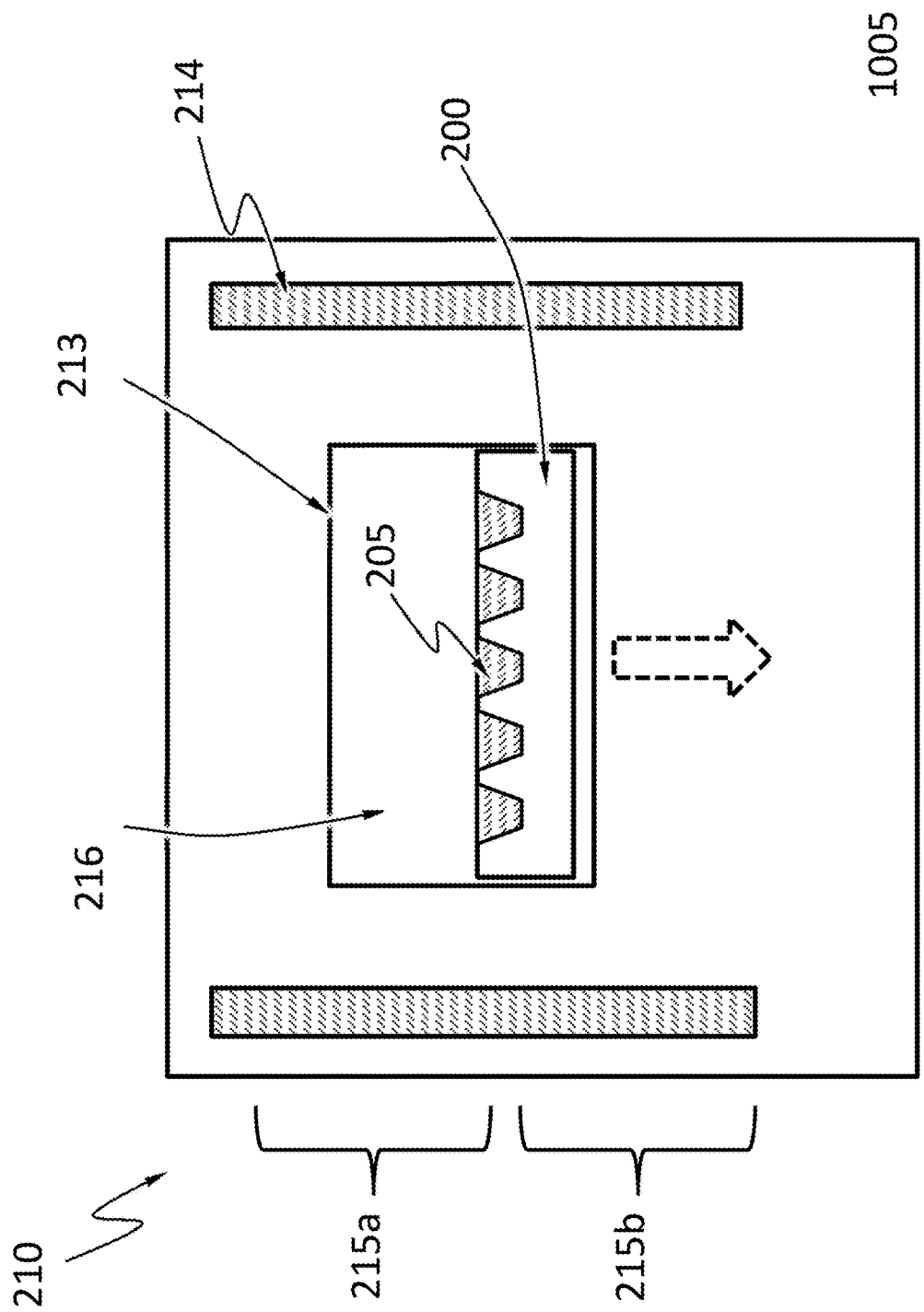
Figure 3:
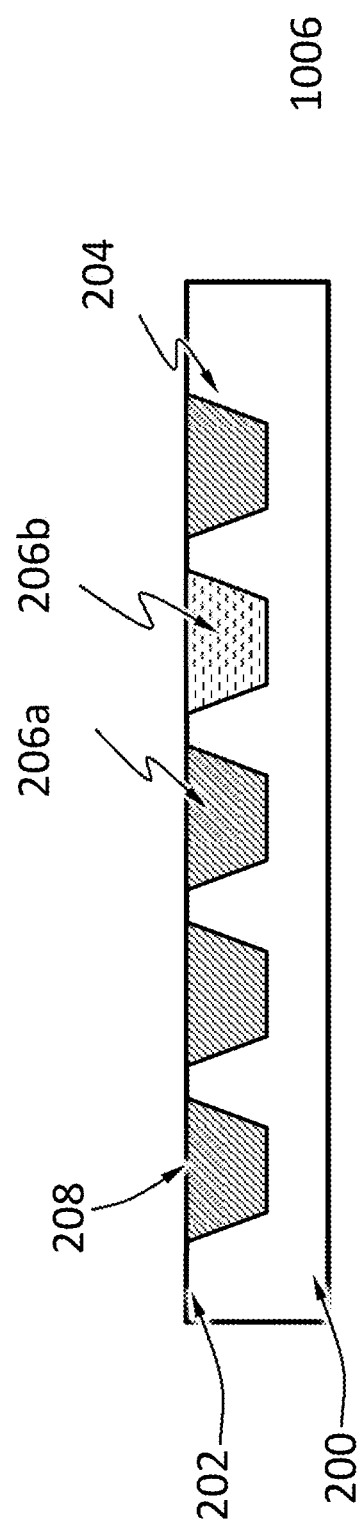

FIG. 3 schematically illustrates a process of forming the recesses 104 in the substrate 102 and forming the semiconductor single crystal 106 in the recesses 104 in FIG. 2B, according to an embodiment.

In step 1000, a mask layer 203 is formed onto a surface 202 of a substrate 200. The substrate 200 may include a semiconductor material such as, silicon, germanium, GaAs, or a combination thereof. The mask layer 203 may serve as an etch mask for forming recesses 204 as shown in step 1002a or step 1002b. The mask layer 203 may comprise a material such as silicon dioxide, silicon nitride, amorphous carbon or metals (e.g., aluminum, chromium). The thickness of the mask layer 203 may be determined according to the depth of the recesses 204 and etching selectivity (i.e., ratio of etching rates of the mask layer 203 and the substrate 200). In an embodiment, the mask layer 203 may have a thickness of a few microns. The mask layer 203 may be formed onto the surface 202 by various techniques, such as physical vapor deposition, chemical vapor deposition, spin coating, sputtering or any other suitable processes.

In step 1001, the mask layer 203 is patterned to have openings in which the substrate 200 is exposed, shown from a cross-sectional view. Shapes and locations of the openings correspond to the footprint shapes and locations of the recesses 204 to be formed in step 1002a or step 1002b. If the openings have a square shape (as shown in the top view in step 1001) and are arranged into a rectangular array, the recesses 204 also have a square shape in their footprint and are arranged into a rectangular array. The pattern formation on the mask layer 203 may involve lithography process or any other suitable processes. For example, a resist layer may be first deposited (e.g., by spin coating) onto the surface of the mask layer 203, and lithography is followed to form the openings. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 1002a or step 1002b, the recesses 204 are formed into the surface 202 of the substrate 200 by etching portions of the substrate 200 uncovered by the mask layer 203 to a desired depth. The recesses 204 may function as the recesses 104 in FIG. 2B. Each of the recesses 204 may have a shape of a frustum, prism, pyramid, cuboid, cubic or cylinder. In example of step 1002a, the recesses 204 have a pyramid shape; and in example of step 1002b, the recesses 204 have a cuboid shape. Each of the recesses 204 may have a smooth surface.

In an embodiment, etching the portions of the substrate 200 may be carried out by wet etching, dry etching or a combination thereof. Wet etching is a type of etching processes using liquid-phase etchants. A substrate may be immersed in a bath of etchant, and areas not protected by the masks may be removed. The dimensions and shape of the recesses 204 may be defined not only by dimensions and shape of the openings of the mask layer 203, but also material of the substrate 200, liquid chemicals or etchants used, etching rate and duration, etc. In an embodiment, the substrate 200 may be a silicon substrate, and recesses 204 may be formed by anisotropic wet etching with etchants such as potassium hydroxide (KOH), ethylenediamine pyrocatechol (EDP), tetramethylammonium hydroxide (TMAH), etc. During an anisotropic wet etching of the silicon substrate, liquid etchants may etch the silicon substrate at different rates depending upon the silicon crystalline plane exposed to the etchants, so that recesses 204 with different shapes and dimensions may be formed. In example of step 1002a, when the surface 202 is a (100) silicon crystallographic plane, using wet etchants such as KOH can form pyramidal-shaped recesses 204 with flat and angled etched walls. In example of step 1002b, when the surface 202 is a (110) silicon crystallographic plane, using wet etchants such as KOH can form cuboidal-shaped recesses 204 instead.

In step 1003, the mask layer 203 may be removed after forming the recesses 204 by wet etching, chemical mechanical polishing or some other suitable techniques.

In steps 1004-1006, semiconductor single crystals (e.g., 206a in step 1006) are formed in the recesses 204. The semiconductor single crystals (e.g., 206a in step 1006) may function as the semiconductor single crystals 106 of the radiation absorption layer 110 in FIG. 2B. The formation of the semiconductor single crystals (e.g., 206a in step 1006) may be done by various techniques such as melt-growth technique, traveling heater technique, vapor deposition technique, epitaxial crystallization technique, or any other suitable techniques. A melt-growth technique involves melting semiconductor particles ("precursors") and recrystallizing the melt into a single crystal of the semiconductor. For example, melt-growth techniques such as vertical Bridgeman method and high-pressure Bridgman method may be used to form CdZnTe single crystals. A vapor deposition technique may involve vaporizing suitable semiconductor precursors and forming a semiconductor single crystal on a substrate from the vaporized semiconductor precursors. For example, a CdZnTe single crystal may be formed on a GaAs substrate from vaporized precursors cadmium telluride and zinc telluride. A vapor deposition technique may also be applied together with an epitaxial crystallization technique. For example, a metalorganic vapor-phase epitaxy technique can be used to form an epitaxial layer of CdTe or CdZnTe single crystal on a GaAs or Si substrate, with precursors such as dimethylcadmium (DMCd), dimethylzinc (DMZn) and diethyltellurium (DETe) and hydrogen as a carrier gas. Choice of suitable techniques to form semiconductor single crystals 206a in the recesses 204 depends on the properties of the semiconductor material, the substrate material, etc.

In example of steps 1004-1006, formation of CdZnTe single crystals 206a in the recesses 204 is illustrated using a vertical Bridgeman technique. In step 1004, CdZnTe particles 205 (e.g., CnZnTe polycrystal particles) may be deposited into the recesses 204. In step 1005 and step 1006, the CdZnTe single crystals 206a (shown in step 1006) may be formed by melting the CdZnTe particles 205, and then recrystallizing the melt by cooling the melt in the recesses 204. In example of step 1005, the formation process may be carried out in a vertical Bridgeman furnace 210 comprising a growth chamber 213 and heating elements 214. The substrate 200 (with the CdZnTe particles 205) is enclosed in the growth chamber 213, which can move relative to the heating elements 214. The temperature profile of the furnace 210 may be controlled by the heating elements 214, so that the furnace 210 may have a hot zone 215a and a gradient zone 215b. The hot zone 215a may have a temperature equal to or above the melting temperature of the CdZnTe particles 205. In the gradient zone 215b, temperature gradually decreases from the temperature in the hot zone 215a to temperatures below the melting temperature. When the growth chamber 213 is in the hot zone 215a, the CdZnTe particles 205 in the recesses 204 melt. The melt consists of volatile components to form a vapor above the melt, and the vapor predominantly consists of Cd atoms since Cd has the highest vapor pressure among the CdZnTe melt constituents. To suppress possible leakage of the vapor and to reduce the possibility of chamber rupture, the growth chamber 213 may be pressurized with an inert gas 216 such as argon. As the growth chamber 213 enters the gradient zone 215b from the hot zone 215a (e.g., along a direction shown by a dashed arrow) at a very low speed (e.g., 1-2 mm/h), the melt is cooled and starts to recrystallize from the lower end so that CdZnTe single crystals 206a form progressively in the recesses 204. In an embodiment, additional Cd vapor may be sent into the growth chamber 213 to compensate any Cd loss and provide a fine control of molar concentrations of Cd and Zn of the CdZnTe single crystals. In an embodiment, the formation process can also be carried out in a horizontal geometry.

In an embodiment, a recess 204 may contain more than one semiconductor single crystal. For example, a semiconductor polycrystal 206b or amorphous (or non-crystalline) semiconductor particle may be formed in a recess 204 instead of a semiconductor single crystal 206a. The semiconductor polycrystal 206b comprises more than one crystallites that of different size and orientation in it. The yield of the semiconductor single crystals 206a (i.e., the percentage of recesses 204 that have only semiconductor single crystals 206a) may depend on the formation technique applied, properties of the semiconductor material, formation conditions, etc. In example of step 1005, the yield of CdZnTe single crystals may be tuned by the cooling rate, which can be adjusted by the moving speed of the growth chamber 213, length of the gradient zone 215b, etc.

In step 1006, the surface 202 of the substrate 200 may be polished after the formation of the semiconductor single crystals 206a, by wet etching, chemical mechanical polishing or some other suitable techniques. After polishing, the surface 202 is coextensive with one surface 208 of each of the semiconductor single crystals 206a. The surfaces 202 and 208 may be flat and smooth after polishing.

Figure 4:
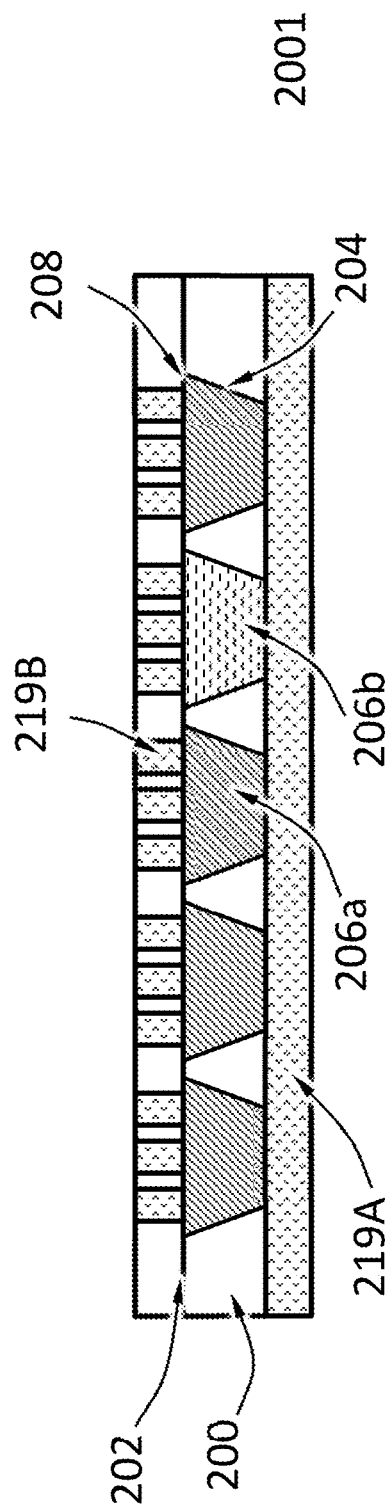
FIG. 4 schematically illustrates a process of forming electrical contacts of the radiation absorption layer in FIG. 2B, according to an embodiment.

FIG. 4 schematically illustrates a process of forming electrical contacts 119A and 119B of the radiation absorption layer 110 in FIG. 2B, according to an embodiment.

In step 2000a or step 2000b, the electrical contact 219A is formed on the semiconductor single crystals 206a and may function as the electrical contact 119A in FIG. 2B.

In step 2000a, the electrical contact 219A may be doped substrate 200. In an embodiment, the substrate 200 acquired at the very beginning may be doped and electrically conductive, so that the substrate 200 may be configured to function as the electrical contact 219A. In another embodiment, the electrical contact 219A may be formed by doping a layer of or the entire substrate 200 from another surface 201 with p type or n type dopants. If the electrical contact 219A is a layer of the substrate 200 being doped, the layer is in contact with another surface 207 of each of the semiconductor single crystals 206a.

In step 2000b, which is an alternative to step 2000a, the electrical contact 219A may be formed by polishing the surface 201 of the substrate 200 to expose the surface 207 of the semiconductor single crystal 206a, and then depositing a layer of conductive material onto the surface 207. Polishing the surface 201 may be done by wet etching, chemical mechanical polishing or some other suitable techniques. The surface 207 of the semiconductor single crystal 206a is coextensive with the surface 201 of the substrate 200 after polishing. The conductive material may be a metal such as Pt, Au or In, or any other suitable conducting materials, and may be deposited onto the surfaces 201 and 207 the by a suitable technique such as physical vapor deposition, chemical vapor deposition, spin coating, sputtering, etc. The electrical contact 219A may comprise discrete regions.

In an embodiment, the electrical contact 219A may be formed by depositing a layer of conductive material (such as Pt, Au or In) in the interior of the recess 204 before forming the semiconductor single crystal 206a in the recess.

In step 2001, the electrical contact 219B is formed on the semiconductor single crystals 206a and may function as the electrical contact 119B in FIG. 2B. The electrical contact 219B may comprise discrete regions, and each of the semiconductor single crystals 206a may be in contact with one or more of the discrete regions. Forming the electrical contact 219B may involve forming a mask with openings on the surfaces 202 and 208 after polishing by processes similar to the step 1001 shown in FIG. 3. Conducting materials such as metal (e.g., Pt, Au, In) may be deposited into the openings the by a suitable technique such as physical vapor deposition, chemical vapor deposition, spin coating, sputtering, etc., so that the electrical contact 219B form.

In FIG. 3 and FIG. 4, some intermediate steps such as surface cleaning, polishing, surface passivation, substrate dicing may be carried out but are not shown. For example, more than one die may be formed on the substrate 200, and each die may be diced off from the substrate 200 and may function as an embodiment of the radiation absorption layer 110. The order of the steps shown in FIG. 3 and FIG. 4 may be changed to suit different formation needs.

Figure 5:
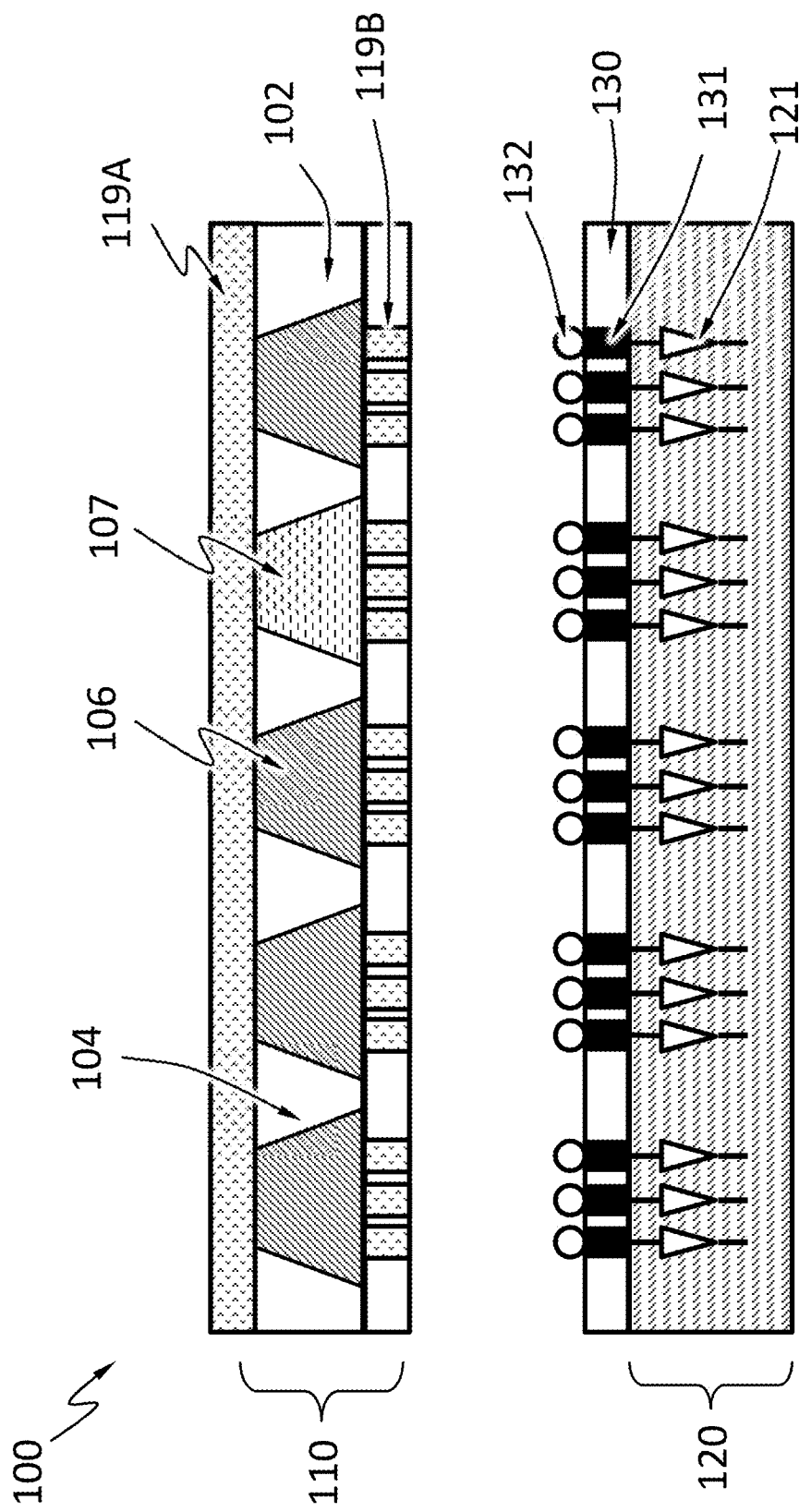
FIG. 5 schematically illustrates bonding between the radiation absorption layer and the electronics layer to form the radiation detector, according an embodiment.

FIG. 5 schematically illustrates bonding between the radiation absorption layer 110 and the electronics layer 120 to form the radiation detector 100, according an embodiment. In example of FIG. 5, the radiation absorption layer 110 may also comprise one or more semiconductor polycrystals 107 or amorphous (or non-crystalline) semiconductor particles in one or more recesses 104 respectively. Each of the discrete regions of the electrical contact 119B may bond to each of the vias 131 by a suitable technique such as direct bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 132 deposited onto contact pads (e.g., discrete regions of the electrical contact 219B of the radiation absorption layer 110 or contacting surfaces of the vias 131). Either the radiation absorption layer 110 or the electronic layer 120 is flipped over and discrete regions of the electrical contact 119B are aligned to the vias 131. The solder bumps 132 may be melted to solder the electrical contact 119B and the vias 131 together. Any void space among the solder bumps 132 may be filled with an insulating material.

Figure 6:
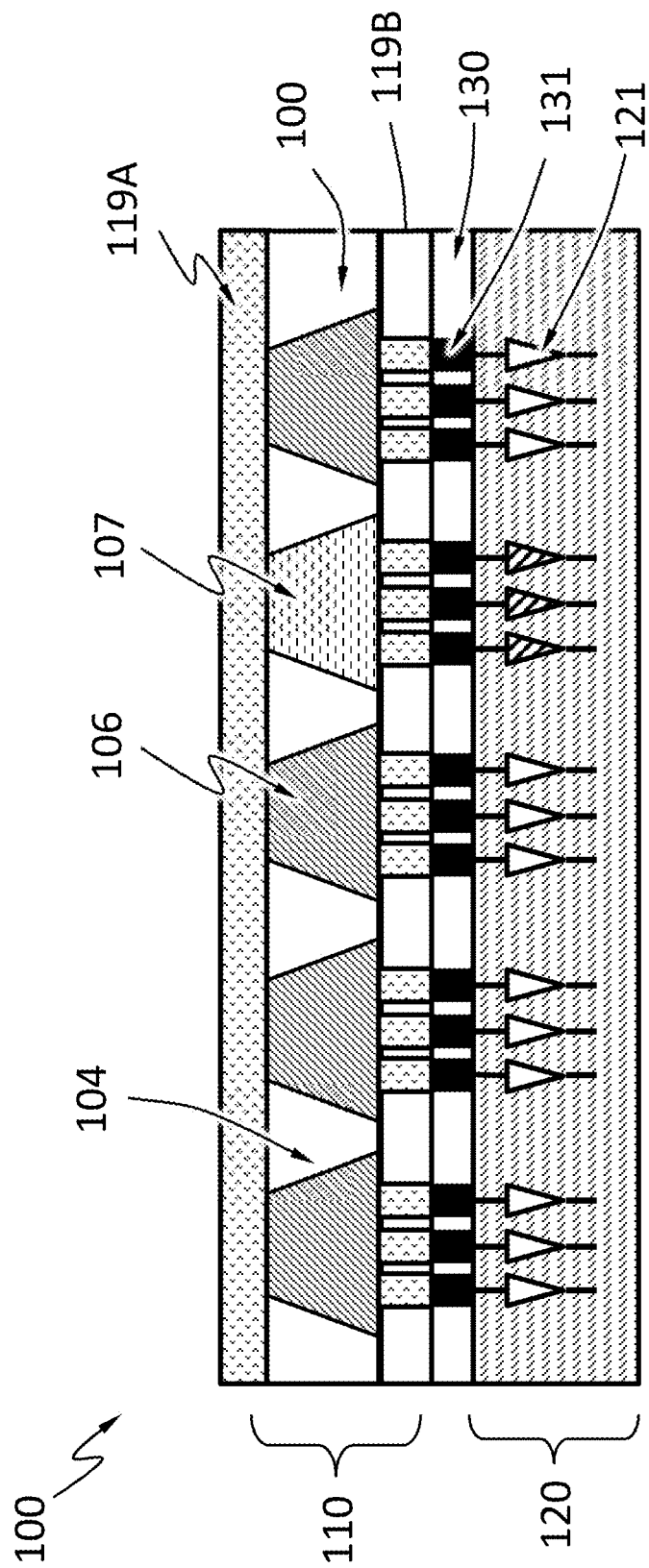
FIG. 6 schematically illustrates the radiation detector having a pixel being deactivated, according to an embodiment.

As shown in FIG. 6, the radiation detector 100 may have one or more pixels 150 associated with one or more discrete region of the electrical contact 119B being deactivated. A production test may be carried out to test each of the pixels 150 associated with a discrete region of the electrical contact 119B. A voltage bias (e.g., 5 volts) may be applied to each of pixels 150 being tested. The electronic system 121 may be configured to measure a first voltage of the discrete region of the electrical contact 119B caused by the dark current during a fixed time, or the time it takes for the first voltage to reach a threshold voltage, or a second voltage of the discrete region of the electrical contact 119B caused by current generated upon absorption of radiation particles from an standard radiation source during a fixed time, or the time it takes for the second voltage to reach the threshold voltage. The first voltage or a signal to noise ratio (defined as the ratio of the second voltage of the electrical contact 119B to the first voltage of the electrical contact 119B) may be used to determine whether a pixel 150 need to be deactivated or voided. For example, if a discrete region of the electrical contact 119B associated with a pixel 150 has a first voltage or a signal to noise ratio larger than a tolerated value, the pixel 150 may be deactivated by the electronic system 121 during normal operations of the radiation detector 100. In example of FIG. 6, the discrete regions of the electrical contact 119B in contact with a semiconductor polycrystal 206b or amorphous (or non-crystalline) semiconductor particle may have a first voltage or a signal to noise ratio larger than the tolerated value, and the pixels 150 associated may be deactivated.

Figure 7A:
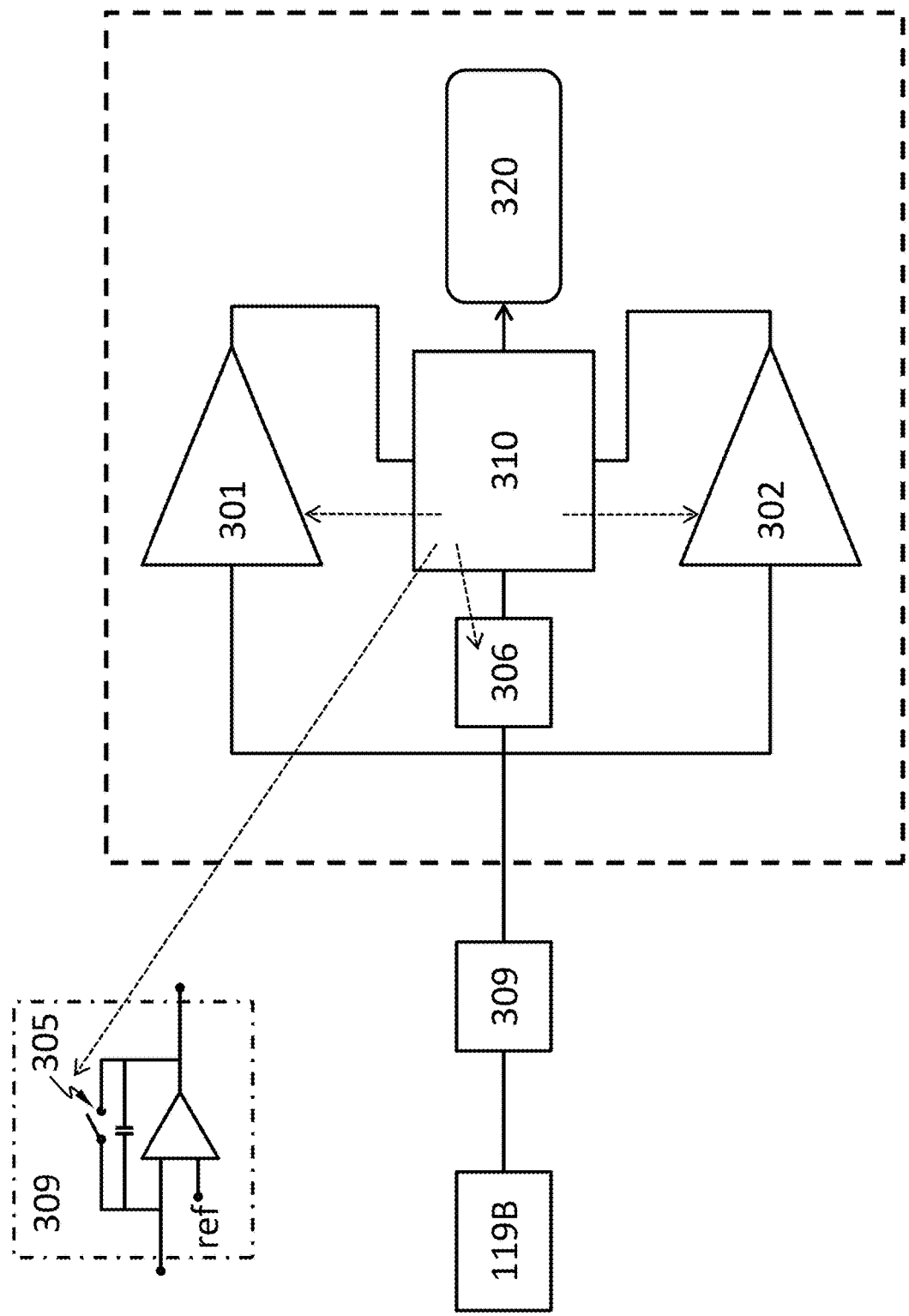
FIG. 7A and FIG. 7B each show a component diagram of the electronic system, according to an embodiment.
Figure 7B:
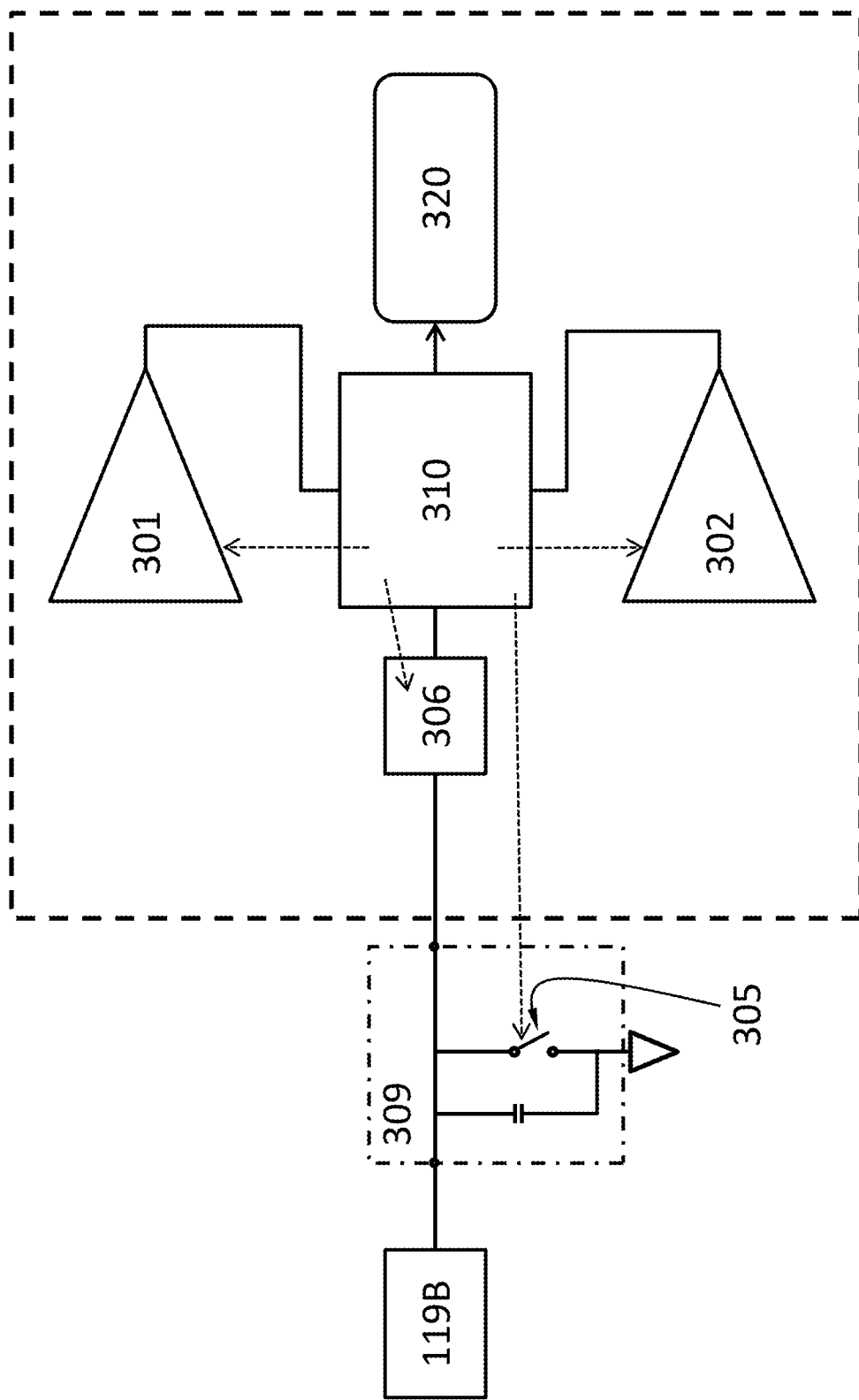

FIG. 7A and FIG. 7B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode (e.g., a discrete portion of electrical contact 119B on a semiconductor single crystal 106) to a first threshold. The first voltage comparator 301 may be configured to monitor the voltage directly, or calculate the voltage by integrating an electric current flowing through the electrode over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the electronic system 121 misses signals generated by an incident radiation particle. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the electronic system 121 to miss signals generated by some incident radiation particles. When the incident radiation intensity is low, the chance of missing an incident radiation particle is low because the time interval between two successive radiation particles is relatively long. Therefore, the first voltage comparator 301 configured as a clocked comparator is especially suitable when the incident radiation intensity is relatively low. The first threshold may be 5-10%, 10%-20%, 20-30%, 30-40% or 40-50% of the maximum voltage one incident radiation particle may generate in the semiconductor single crystal 106. The maximum voltage may depend on the energy of the incident radiation particle (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold V2. The second voltage comparator 302 may be configured to monitor the voltage directly, or calculate the voltage by integrating an electric current flowing through the electrode over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. The second threshold may be at least 50% of the maximum voltage one incident radiation particle may generate in the semiconductor single crystal 106. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the electronic system 121 to operate under a high flux of incident radiation. However, having a high speed is often at the cost of power consumption.

The counter 320 is configured to register a number of radiation particles reaching the semiconductor single crystal 106. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on the voltage of which electrode (e.g., a cathode or an anode) is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 8:
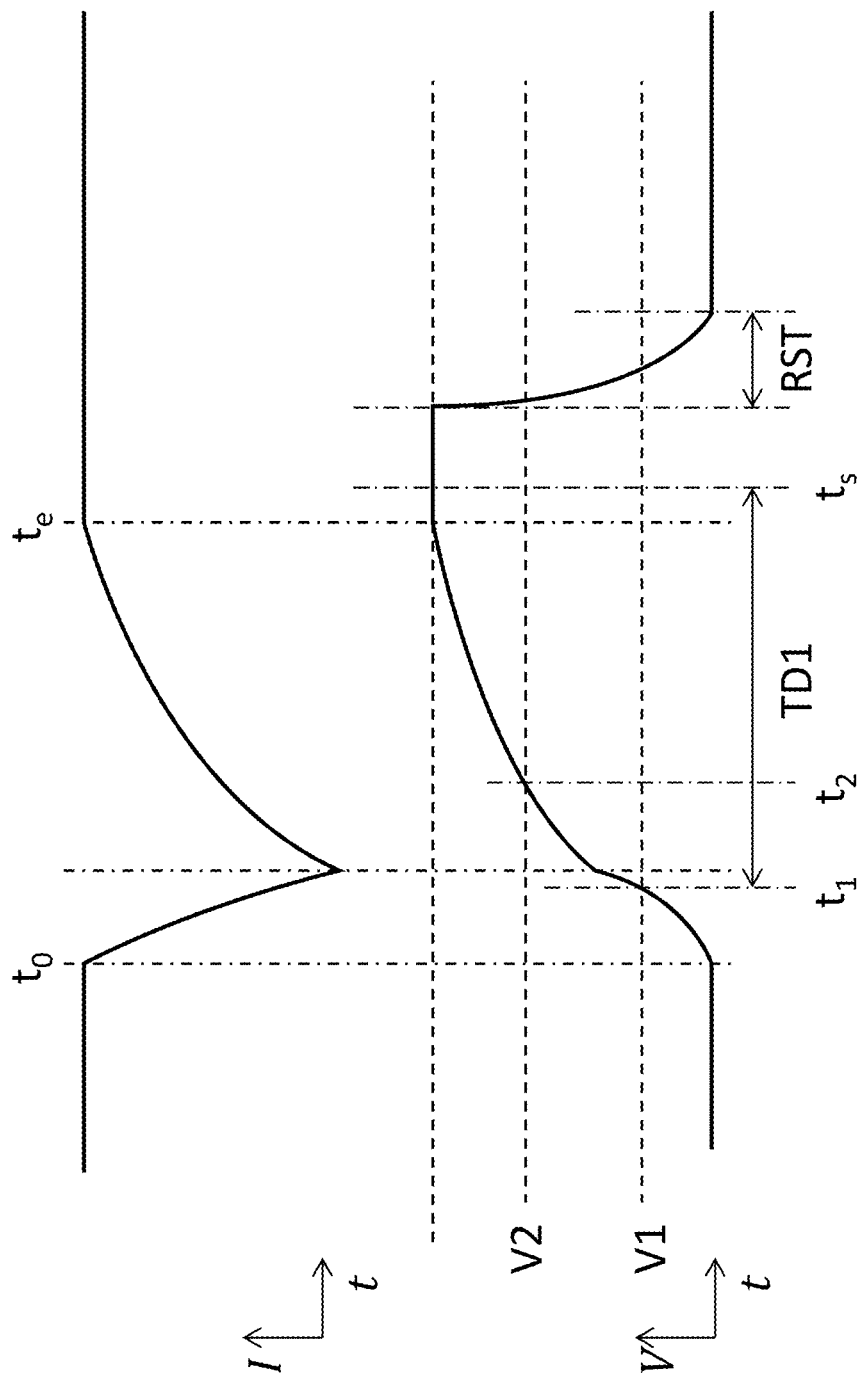
FIG. 8 schematically shows a temporal change of the voltage of the electrode or the electrical contact, according to an embodiment.

The electronic system 121 may include a capacitor module 309 electrically connected to the electrode, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 8, between $t_0$ to $t_1$, or $t_1$-$t_2$). After the integration period has expired, the capacitor voltage is sampled and then reset by a reset switch. The capacitor module can include a capacitor directly connected to the electrode.

FIG. 8 schematically shows a temporal change of the electric current flowing through the electrode (upper curve) caused by charge carriers generated by a radiation particle incident on the semiconductor single crystal 106, and a corresponding temporal change of the voltage of the electrode (lower curve). The voltage may be an integral of the electric current with respect to time. At time to, the radiation particle hits the semiconductor single crystal 106, charge carriers start being generated in the semiconductor single crystal 106, electric current starts to flow through the electrode of the semiconductor single crystal 106, and the absolute value of the voltage of the electrode starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the radiation particle drift out of the radiation absorption layer 110. At time $t_s$, the time delay TD1 expires. In the example of FIG. 8, time $t_s$ is after time $t_e$; namely TD1 expires after all charge carriers generated by the radiation particle drift out of the radiation absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a radiation particle, which relates to the energy of the radiation particle. The controller 310 may be configured to determine the energy of the radiation particle based on voltage the voltmeter 306 measures. One way to determine the energy is by binning the voltage. The counter 320 may have a sub-counter for each bin. When the controller 310 determines that the energy of the radiation particle falls in a bin, the controller 310 may cause the number registered in the sub-counter for that bin to increase by one. Therefore, the electronic system 121 may be able to detect a radiation image and may be able to resolve radiation particle energies of each radiation particle.

After TD1 expires, the controller 310 connects the electrode to an electric ground for a reset period RST to allow charge carriers accumulated on the electrode to flow to the ground and reset the voltage. After RST, the electronic system 121 is ready to detect another incident radiation particle. Implicitly, the rate of incident radiation particles the electronic system 121 can handle in the example of FIG. 8 is limited by 1/(TD1+RST). If the first voltage comparator 301 has been deactivated, the controller 310 can activate it at any time before RST expires. If the controller 310 has been deactivated, it may be activated before RST expires.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
    forming recesses into a substrate;
    forming semiconductors respectively in the recesses, wherein the semiconductors have different chemical composition from the substrate;
    forming first electrical contacts on a first surface of the semiconductors, wherein the first surface is not in direct contact with the substrate;
    bonding the substrate to another substrate comprising electronic systems therein or thereon, wherein the electronic systems are respectively connected to the first electrical contacts and configured to respectively process electrical signals from the first electrical contacts;
    determining whether the semiconductors are single-crystalline using the electronic systems;
    deactivating only the electronic systems connected to the first electrical contacts on those of the semiconductors that are not single crystalline, without detaching the electronic systems therefrom.

2. The method of claim 1, wherein the semiconductors are cadmium zinc telluride (CdZnTe) or cadmium telluride (CdTe).

3. The method of claim 1, wherein the substrate comprises silicon, germanium, GaAs or a combination thereof.

4. The method of claim 1, wherein the recesses have a shape of a frustum, prism, pyramid, cuboid, cubic or cylinder.

5. The method of claim 1, wherein forming the recesses comprises forming a mask on the substrate and etching portions of the substrate uncovered by the mask.

6. The method of claim 5, wherein the mask comprises a metal, silicon nitride, silicon dioxide, or carbon.

7. The method of claim 5, wherein etching the portions is done by wet etching, dry etching or a combination thereof.

8. The method of claim 1, further comprising polishing the substrate such that the first surface of the semiconductors and a surface of the substrate are coextensive.

9. The method of claim 1, wherein the substrate is electrically conductive, wherein the substrate is in electrical contact with the semiconductors.

10. The method of claim 1, further comprising forming second electrical contacts by doping a layer of the substrate from a surface of the substrate, wherein the second electrical contacts are respectively in electrical contact with the semiconductors.

11. The method of claim 1, further comprising forming second electrical contacts by depositing a layer of conductive material in interior of the recesses before forming the semiconductors.

12. The method of claim 1, further comprising forming second electrical contacts by polishing a surface of the substrate to expose a second surface of the semiconductors and depositing a layer of conductive material onto the second surface of the semiconductors.

* * * * *